United States Patent [19]
Pritchard

[11] Patent Number: 5,636,284
[45] Date of Patent: Jun. 3, 1997

[54] SOLID STATE EMULATION OF VACUUM TUBE AUDIO POWER AMPLIFIERS

[76] Inventor: Eric K. Pritchard, Rte. 1, Box 536, Berkeley Springs, W. Va. 25411

[21] Appl. No.: 202,369

[22] Filed: Feb. 25, 1994

Related U.S. Application Data

[63] Continuation-in-part of Ser. No. 914,596, Jul. 20, 1992, Pat. No. 5,434,536, which is a continuation-in-part of Ser. No. 466,865, Jan. 18, 1990, Pat. No. 5,133,014, which is a Continuation-in-part of PCT/US88/01025 Mar. 23, 1988 which is a continuation-in-part of Ser. No. 29,144, Mar. 23, 1987, Pat. No. 4,809,336.

[51] Int. Cl.$^6$ ............................................. H03G 3/00
[52] U.S. Cl. ............................................. 381/61
[58] Field of Search ............................ 381/61, 118, 120

[56] References Cited

U.S. PATENT DOCUMENTS

| | | |
|---|---|---|
| 3,742,261 | 6/1973 | Schneider et al. . |
| 4,330,754 | 5/1982 | Hartley . |
| 4,439,742 | 3/1984 | Sondermeyer ............................ 330/262 |
| 4,627,094 | 12/1986 | Scholz . |
| 4,683,589 | 7/1987 | Scholz et al. . |
| 4,752,960 | 6/1988 | Scholz . |
| 4,987,381 | 1/1991 | Butler ......................................... 381/61 |
| 5,032,796 | 7/1991 | Tiers et al. ................................. 381/121 |
| 5,268,527 | 12/1993 | Waller, Jr. . |
| 5,343,159 | 8/1994 | Butler ......................................... 381/120 |
| 5,434,536 | 7/1995 | Pritchard ................................... 327/599 |
| 5,467,400 | 11/1995 | Keir ............................................ 381/61 |
| 5,524,055 | 6/1996 | Sondermeyer ............................ 381/61 |

OTHER PUBLICATIONS

Robert Schoonmaker, R. Schoonmaker Response to Glass Audio Article Re: Kirk Elliott, Aug. 1, 1992, 14 pages.
Scott Reynolds, Vacuum–Tube Models for Pspice Simulations, *Glass Audio*–Apr. 1993, 4 pages. pp. 17, 18, 20 and 23.
T.E. Rutt, Vacuum Tube Triode Nonlinearity as Part of the Electric Guitar Sound, *An Audio Engineering Society Preprint*, 13 pages, Oct. 1984.
Fender Schematic Diagram, H.O.T. Amplifier; Dated Jan. 5, 1990.

*Primary Examiner*—Forester W. Isen
*Attorney, Agent, or Firm*—Barnes & Thornburg

[57] ABSTRACT

Solid state emulations of vacuum tube power amplifier are shown for both high-power and low-power applications. The emulations include the screen grid and power supply effect of compression, the variable output impedance for reacting with a speaker load, power tube distortions, the limiting and bias shifting created by the power tube grids, and the bias shifting of the phase splitter. The high-power disclosure includes a current amplifier which may be linear or switching. The low-power disclosure simulates a vacuum tube amplifier with a speaker load in order to drive a master volume without diminishing the classic distorted tone. It has means to simulate the speaker impedance. The solid state emulation includes a gain control means which produce an unclipped region which may be divided into more or less distortion than one percent and two clipped regions having different output impedances or different frequency characteristics.

54 Claims, 4 Drawing Sheets

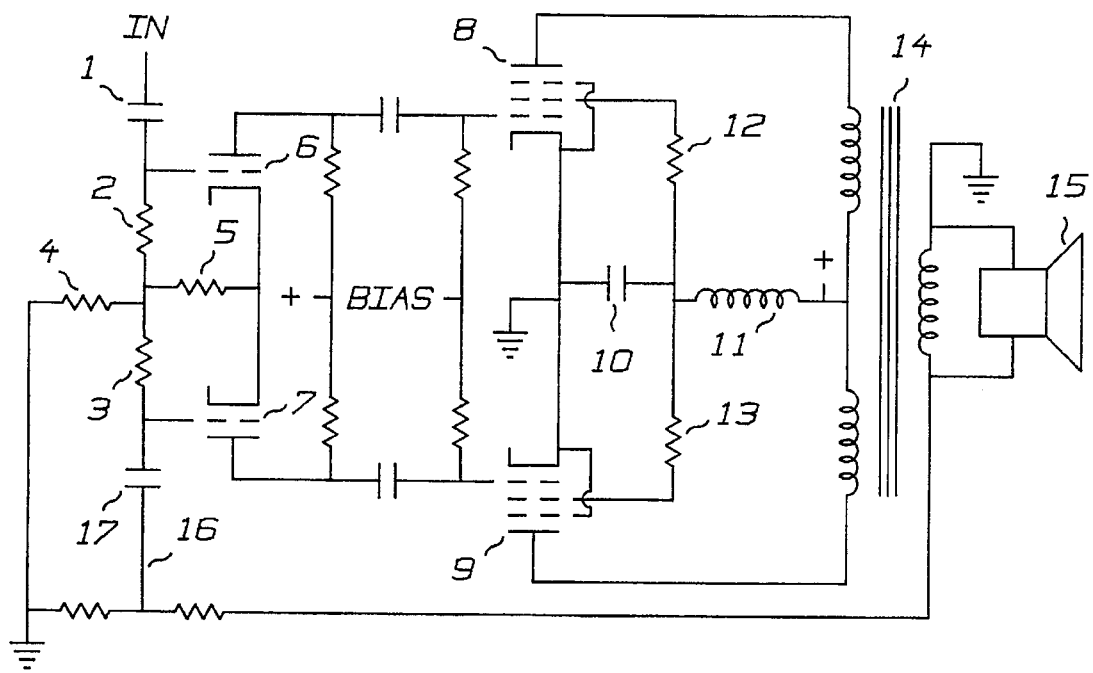
PRIOR ART    FIG 1
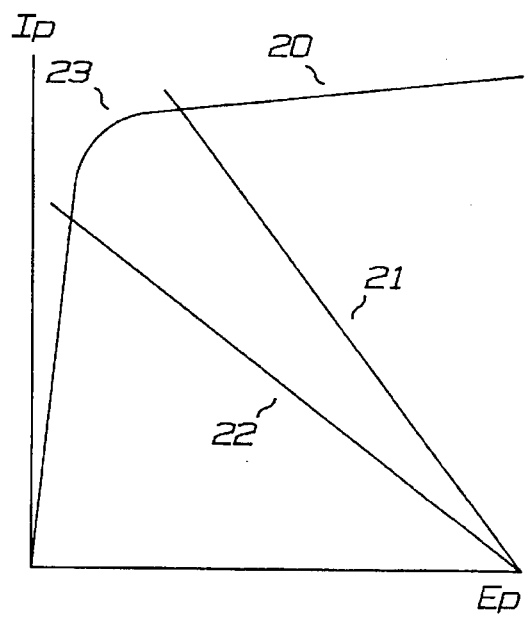
FIG 2
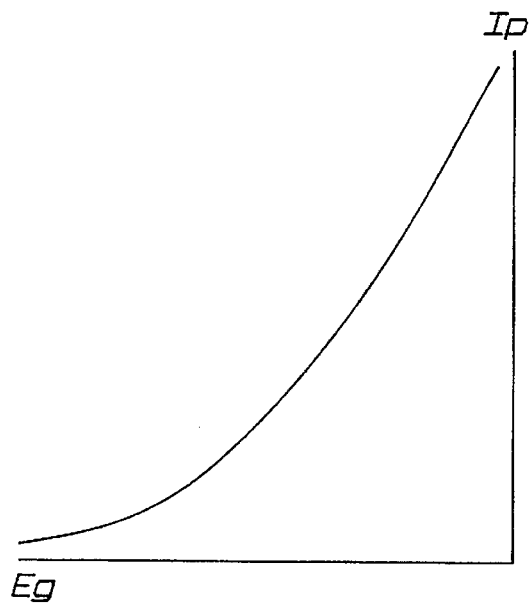
FIG 3

SOLID STATE EMULATION OF VACUUM TUBE AUDIO POWER AMPLIFIERS

CROSS REFERENCE

This is a continuation-in-part of U.S. application Ser. No. 07/914596 filed Jul. 20, 1992, now U.S. Pat. No. 5,434,536, which is a continuation-in-part of U.S. patent application Ser. No. 07/466,865 filed Jan. 18, 1990, which is now U.S. Pat. No. 5,133,014 issued Jul. 21, 1992, which is a continuation-in-part of PCT/US88/01025 filed Mar. 23, 1988, which is now U.S. Pat. No. 4,995,084 issued Feb. 19, 1991, which is a continuation-in-part of U.S. Ser. No. 29,144 filed Mar. 23, 1987, which is now U.S. Pat. No. 4,809,336 issued Feb. 28, 1989.

BACKGROUND OF THE INVENTION

This invention relates to the emulation of vacuum tube audio power amplifiers. It incorporates non-linear properties of semiconductors to replicate non-linear properties of vacuum tubes. It incorporates filters to replicate response properties of vacuum tube power amplifier circuits. This invention further relates to the low-level emulation of said vacuum tube audio power amplifier connected to a speaker load.

THE PRIOR ART

FIG. 1 is a prior art tube power amplifier. The input is coupled into the amplifier with capacitor 1. The triodes 6 and 7 form a differential amplifier phase splitter that drives the output tubes 8 and 9. Transformer 14 couples their power with appropriate impedance matching to the speaker 15 and feedback 16.

The first important feature of this circuit is the bias shifting capability of the input circuit. The capacitor 1 is charged by the diode action of the grid and cathode of triode 6. This charge also forces a charge on the feedback capacitor 17 by way of resistor network 2 through 4 and triodes 6 and 7. Since the time constants involving these two capacitors are different, the differential bias across the grids of tube 6 and 7 changes with time and helps alter the harmonic structure of the output. It contributes the swirl of timbre of a decaying note.

The second important feature of this circuit is the grid conduction of tubes 8 and 9. These tube are coupled to the high impedance drivers, triodes 6 and 7. This grid conduction and the high impedance drive limits the drive capability of the power tubes at the zero grid voltage curve shown in FIG. 2. This is particularly important when considering the variation of load lines. The nominal load line 21 intersects the zero grid voltage curve 20 above the knee 23 while a higher impedance load line 22 intersects the zero grid voltage curve below said knee.

Since the speaker has an impedance curve which has a low impedance at middle frequencies and a high impedance at the bass resonance the load lines 21 and 22 have particular interest. In the absence of feedback created by omission or by grid conduction or driver saturation, the speaker load only interacts with the plate curves similar to that of FIG. 2. This implies that the bass frequencies have more output than the middle frequencies. The use of feedback reduces this effect when the feedback is operational and makes the over driven bass response more noticeable.

This clipping behavior divides the clipping region in two, the first is with a low impedance, mid-frequency load where the current drive of the tubes is at a maximum. The second is with a higher impedance, bass frequency where the tubes saturate.

This is the failing of the typical master volume control. Turning down the master volume reduces the output signal below grid conduction and leaves the feedback completely operational. The distortion then comes from the preamplifier which does not have output stage characteristics and do not accentuate the distorted bass. Master volume controls within the feedback loop are better but also increase the output impedance so that at low levels the feedback has little effect. While there is accentuation of the distorted bass all bass is accentuated so there is not the vintage differential between distorted and non-distorted tones. This has inspired the low-power emulation of amplifier and speaker.

Notice that having a limit prior to the output that limits the range of the output is contrary to engineering logic because it wastes the capability and power of the output stage. However, this feature is important to the operation of the classic amplifiers.

The third important feature is the screen grid circuit. The screen grid modulates the current in the power tubes 8 and 9 and can produce the compression associated with tube circuits. This overlooked characteristic combined with the power supply filtering, not shown in FIG. 1, and further screen grid filtering shown as capacitor 10 and choke 11. The increase in screen current, although limited somewhat by resistors 12 and 13, and the dropping sagging power supply, not shown, creates a drop in the screen voltages. The characteristic of this drop is determined by the relative sizes of the capacitor, inductor, and further load on capacitor 10 usually by the phase splitter and preamplifier stages.

The drop in screen voltages lowers current drawn by tubes 8 and 9 and further lowers their transconductance or gain. Hence the power stage compresses. This action moves boundaries to the clipped region.

The forth feature is the gain characteristic of the vacuum tube. The slope of the plate current versus grid voltage curve, FIG. 3, is always increasing. This leads to an ever increasing distortion without clipping. The push-pull nature of the circuit limits this distortion to the odd harmonics. The imperfect balance of the output stage allows some even harmonics to remain. The impact of this characteristic is to leave low-level signals essentially distortion free with less than 1 percent distortion and to distort higher level signals. This distortion is needed for the classic tone because it blends into the clipping distortion.

The one percent distortion level has been used in the art as a dividing line between low-distortion and high distortion.

The fifth feature of the amplifier is the bias circuit. Although FIG. 1 shows fixed biasing, cathode biasing is also common in lower power amplifiers. The cathode biasing with its incomplete bypassing creates an effect similar to the compressive action of the screen but at much shorter time constants.

The sixth feature of the amplifier is the character of the plate curves as altered by the screen resistors. A large round knee produces a softer clip than a sharp knee.

OBJECTS OF THE INVENTION

These six features plus the effect of the speaker load are the targets of the embodiments of the invention.

The primary object of this invention is a controlled amplifier for providing a variable gain in response to a gain control signal and for driving an output means which supplies the output and drives the gain control means which produces said gain control signal. The output means may drive a speaker load or may drive a low-level load and include means for emulating the resonance of a speaker load. The controlled amplifier and the gain control means combine to produce the various regions of operation.

A second object of this invention is to perform this amplification function in the analog and digital domains.

A third object of this invention is a solid state amplifier that replicates the four regions of vacuum tube amplifier behavior: unclipped and substantially linear, unclipped and distorted, clipped with high output impedance, and clipped with low output impedance. This object is extended to amplifiers with speaker emulators having the following regions: unclipped and substantially linear, unclipped and distorted, clipped at low frequencies at a level, and clipped at middle frequencies at a lower level.

A fourth object of this invention is means for providing the signal of microphone listening to a speaker that is driven by a vacuum tube amplifier.

Other objects, advantages and novel features of the present invention will become apparent from the following detailed description of the invention when considered in conjunction with the accompanying drawings.

DESCRIPTION OF THE FIGURES

FIG. 1 is a vacuum tube amplifier representative of the prior art.

FIG. 2 is a pentode plate curve with load lines.

FIG. 3 is the transfer characteristic of a pentode.

THE FIRST EMBODIMENT

Figure 4:
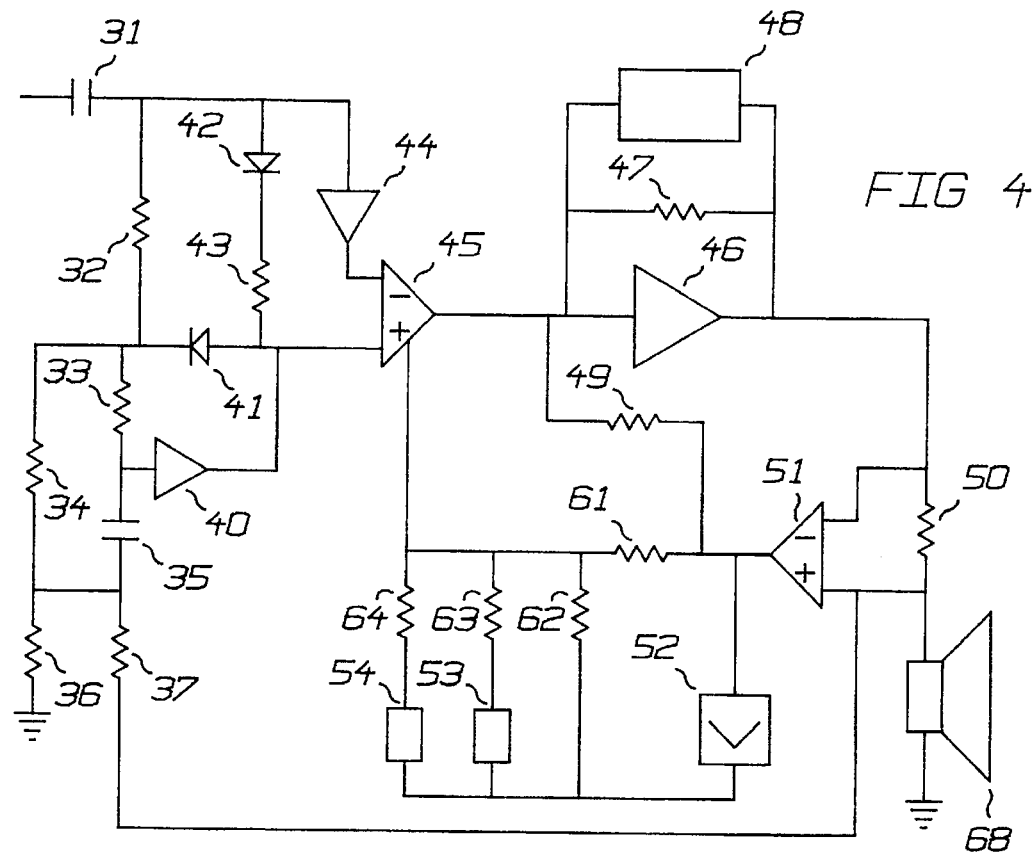
FIG. 4 is a high power, current amplifier embodiment of this invention.

The first embodiment of the invention is shown in FIG. 4. The basic input circuit is simply copied with input coupling capacitor 31 and grid bias resistors 32 and 33. The resistor 34 corresponds to the cathode resistor 4 but must be made much larger since the tubes 6 and 7 do not drive current through this resistor. The feedback is applied through capacitor 35 and voltage divider resistors 36 and 37. Amplifier 40 is a unity gain connected operational amplifier. Diode 41 keeps the common cathode junction between resistors 32 and 33 from going too low. This condition occurs when triode 6 is cutoff. Diode 42 emulates the grid conduction of triode 6. Resistor 43 emulates the effective grid impedance. It may be estimated as the gain of tube 6 times the cathode resistance 4. It is adjusted to provide the desired bias shifting and resulting harmonic generation. Unity gain buffers 40 and 44 prepare the resulting signal for the generally lower impedance transconductance amplifier 45, a CA3080 for example. This drives a power amplifier 46 with a bipolar current. This amplifier has a feedback resistor 47, non-linear network 48, and current feedback components 49 through 51 to produce the output character of push-pull pentodes. The current sense amplifier 51 provides current feedback via resistor 49 and drives an absolute value circuit which in turn drives low pass filters 53 and 54.

The current sense amplifier 51 gives the output amplifier a high output impedance although that may be lowered by the feedback via resistor 37. That feedback is reduced, however, when the transconductance amplifier 45 is driven to its limit which is approximately the bias flowing in resistors 61 through 64. Unlike the standard engineering concept, for normal loads, amplifier 46 does not saturate or clip prior to amplifier 45 reaching its limit. However, for light loads, such as at speaker resonance, amplifier 46 will clip prior to amplifier 45. This gives this circuit two clipped regions, a low impedance and a high impedance, depending upon which amplifier clips or limits.

The current sense amplifier 51 allows the load, the speaker, to be grounded. If this is not required, a current sense resistor can be inserted in the speaker ground lead. In either case, amplifier 46 and current sensing means 50 and 51 or resistor in the speaker ground lead form a current amplifier.

Notice that any current amplifier with the appropriate current and voltage can be substituted for amplifier 46 and current sensing means 50 and 51. A particularly attractive amplifier is class D, a switching amplifier. The switching amplifier is quite stable and works quite well when the predominate feedback is current. Examples of such switching amplifiers may be found in my own U.S. Pat. Nos. 4,272,713, and 4,339,701 which are included herein by reference. These patents disclosed the switching current drive for motors and could readily provide the current drive for speakers by raising the switching speed to provide the greater frequency response needed by audio.

The non-linear network 48 creates the emulation of the soft knee in the plate characteristics of some power tubes such as the EL34, the EL84, and the 6V6. It creates the character by reducing the gain at high output voltages which correspond to low plate voltages of the emulated tubes. This network is detailed below with respect to FIGS. 7–10.

The filter 53 emulates the response of the power supply and produces a negative going output for an increasing magnitude of output current. The character of this filter is a resonant frequency of about 8 hertz with a Q of about 2.

The filter 54 emulates the power tube self bias and also produces a negative going output for an increasing magnitude of output current. The character of this filter is single pole with a time constant of 5 milliseconds.

The resistors 61 through 64 and the difference in nominal output levels of the components 51 through 54 and the bias input of transconductance amplifier 45 biases the transconductance amplifier. This bias sets the transconductance and the maximum magnitude of the output current of said transconductance amplifier 45. The current through resistor 61 creates even harmonics in the output because the gain is a function of the signal. The current through resistor 62 changes the gain of transconductance amplifier 45 with the magnitude of the signal and creates odd harmonics in the output. This resistor 62 needs to be sized to produce harmonic levels less than one percent at low levels and levels greater than one percent at high, but unclipped, levels. The current through resistor 63 creates the screen grid compression effect because the gain is a function of the emulated power supply response. The current through resistor 64 creates the cathode bias effects because the gain is a function of the emulated cathode bias.

Since the total current flow through resistors 61 through 64 determines the maximum current that can flow out of transconductance amplifier 45 and drive the following stage, these must be picked so that low impedance loads do not saturate amplifier 46 and higher impedance loads do saturate amplifier 46. This gives the amplifier its two clipping regions and a portion of the vintage tone.

Further, resistor 62 must be sized to produce the substantial third harmonic found in push-pull amplifiers. This is sized to produce a blending of non-clipped and clipped distortion so that the amplifier distorts over a wide range of inputs. This is the opposite of the usual engineering philosophy of pushing the distortion region up to the clipping point and then paying the price of instant and harsh audible complaints.

Obviously, filter 54 and resistor 64 may be omitted ff cathode or self bias effects are not wanted. However, they do produce a pleasant chime effect.

The absolute value circuit 52 need not be precision. The requisite diodes may exhibit their voltage drops since the effects that this circuit drives and creates occur at large signal levels.

This creates an essentially linear region which then becomes non-linear as the signals approach clipping and produces the other two regions of amplifier operation.

If the feedback is not used, such as in the emulation of the VOX AC30 amplifiers, resistor 37 is omitted and resistor 36 is reduced to zero.

THE SECOND EMBODIMENT

Figure 5:
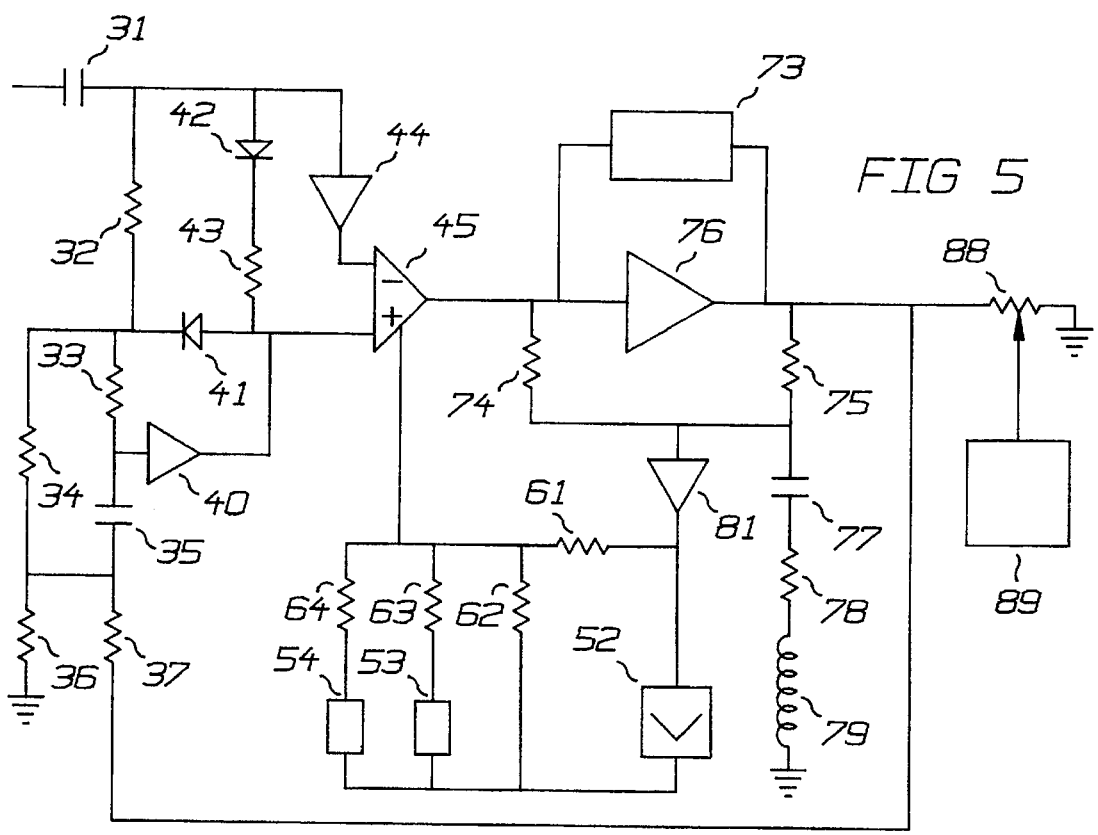
FIG. 5 is a low power embodiment of this invention which include speaker load emulation.

The second embodiment, FIG. 5, of this concept lowers the power output and includes the major portion of the behavior of the speaker 68, its resonance, into the circuit. This circuit uses the same input components 31 through 37 and 40 through 45 of FIG. 4 although the feedback attenuation is reduced for the reduced output level. This circuit also biases the tranconductance amplifier 45 in the same way as in FIG. 4 with absolute value circuit 52, filters 53 and 54, and resistors 61 though 64. The second embodiment differs from FIG. 4 in the last stage which includes the speaker resonance in its character. The transconductance amplifier 45 drives inverting amplifier 76 with a bipolar current. This amplifier 76 has a non-linear feedback 73 similar to 48 and performing the same basic function as 48 but operating over a reduced voltage range. The feedback resistor 47 is split in two portions 74 and 75. Their junction drives a capacitor, resistor, inductor network 77 through 79 respectively and drives the amplifier 81 to supply a signal indicative of the output load current to the transconductance amplifier biasing components 52 through 54 and 61 through 64.

The behavior of network 77 through 79 is the dual of the speaker character because it is located within the feedback loop of the amplifier 76. It is so located because the series resistor 78 and inductor 79 are readily simulated by an operational amplifier circuit, FIG. 6. The standard parallel resonance could be used with a high output impedance amplifier.

By appropriate component selection, the second embodiment can also have four regions of operation. The unclipped regions stay the same as in the first embodiment, essentially linear and non-linear, but the clipped regions change from low and high impedance to low or bass and higher or middle frequencies. The low frequencies are clipped at a higher level than the middle frequencies.

The amplifier 76 drives the master volume control 88 which attenuates the signal for a later power amplifier and speaker or speaker emulator 89. The speaker emulator in this case need only replicate the bass resonance and treble roll off from a signal transfer point of view and need not emulate the resonant load since that has already been done by the network 77 through 79 or its equivalent. The speaker emulator or the emulation of the output of a microphone placed near a speaker is disclosed in my U.S. Pat. No. 4,995,084 as direct equalization and are included herewith by reference.

EMBODIMENT DETAILS

Figure 6:
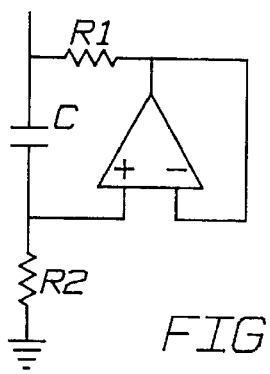
FIG. 6 is a circuit approximately equivalent to a series resistor and inductor.

FIG. 6 is the operational amplifier circuit for emulating the series resistor 78 and inductor 79 with the inductor grounded. The resistor R1 is equal to resistor 78. The inductor 79 is equal to the product of resistors R1 and R2 and the capacitor C. The approximation holds as long as the time constant of R1 * C is short and thereby corresponds to a frequency higher than frequencies of interest, the audible frequencies.

Figure 7:
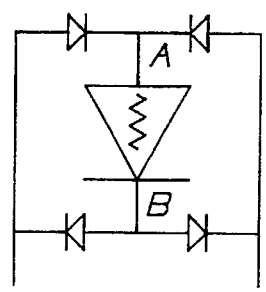
FIG. 7 is the embodiment of the non-linear elements.
Figure 8:
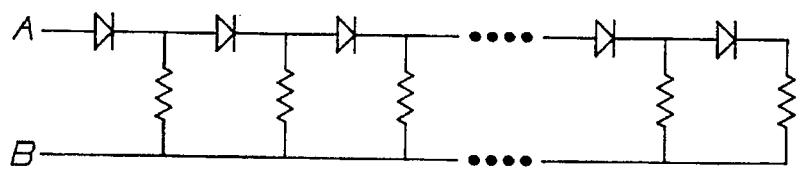
FIG. 8 is a non-linear device using parallel resistors.
Figure 9:
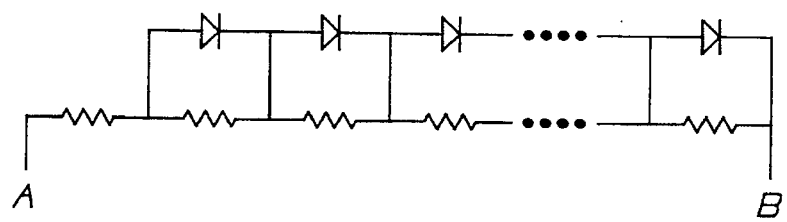
FIG. 9 is a non-linear device using series resistors.
Figure 10:
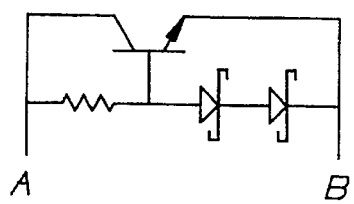
FIG. 10 is a non-linear device using junction characteristics.

FIG. 7 is the embodiment of non-linear networks 48 and 73. It is a diode bridge and a non-linear network shown as a resistor symbol within an oversized diode symbol. There are many possible versions of this non-linear network as shown in FIGS. 8 through 10. The terminals A and B of the resistor/diode symbol of FIG. 7 correspond to the terminals A and B in FIGS. 8 through 10. FIG. 8 shows series diodes with parallel diodes. As the voltage across terminals A and B rises successive diodes turn on. FIG. 9 shows series pairs of parallel resistors and diodes. As the voltage across terminals A and B rises successive diodes turn on and effectively remove resistors from the circuit, starting with the highest value and continuing to the lowest value until the only resistor left is the one without a parallel diode. In either case, the effective resistance from A to B drops as the voltage across A to B increases. This implies that current flowing from A to B flows at an ever increasing rate as said voltage increases. FIG. 10 continues this non-linear characteristic. As the voltage from A to B increases the current through the resistor increases. This current is split through the base-emitter junction and the series Schottkey diodes. The current through the base-emitter junction rises faster than through the diodes because the diodes are two junctions in series while the transistor is only a single diode. The Shottkey diodes have a much larger leakage current than the base-emitter junction and conduct at a much smaller voltage so that the usual voltage compensation for the single diode junction in the transistor is not necessary.

All of these networks can produce the very desirable second harmonic since they can all perform squaring operations. To that end all the resistors of FIG. 8 are the same value. The resistors of FIG. 9 are proportional to the progression 1, ⅓, ⅙, ⅒, 1/15 ... and the resistor without the parallel diode, the nth, is 2/n. FIG. 10 produces an approximate squaring because there is one junction in the transistors and there are two junctions in the series diodes.

DIGITAL EMBODIMENT

Figure 11:
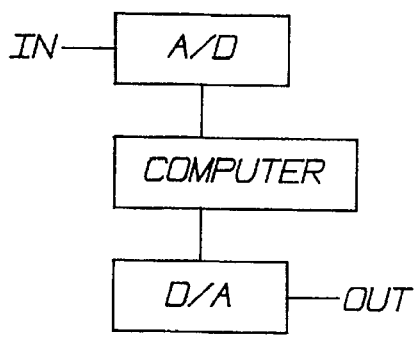
FIG. 11 is a digital embodiment.

The FIG. 11 shows a digital embodiment that creates digital input data with an A/D converter. A computer computes output data from the input data with programs that include the emulation the amplifier behavior. Finally, the D/A converter produces an analog voltage in response to said output data.

Real-time computer emulation of tube circuits is possible since the mathematical quantities of operational amplifiers, resistors, capacitors, and non-linear networks are readily established. See the direct equalization means in my U.S. Pat. No. 4,995,084 which is incorporated herein by reference.

The digital processing of circuit parameters is not new, there are many circuit analysis programs available for computers ranging from personal to mainframe. Digital processing of music is also not new, digital effects and synthesizers are found everywhere. This embodiment only combines the two technologies.

The logical embodiment to implement digitally is FIG. 5, the micropower output stage with speaker load emulation. This can be explained in two steps, first without feedback via resistor 37 and then with the feedback.

The first step recognizes that feedback around a non-linear loop requires more computation than feedforward. Consequently, the harmonic formulations via resistors 61 and 62 will be moved. This leaves only low pass filters in the feedback loop so that the loop needs only one calculation per output instead of many. With that in mind the computer must do the following:

a. Calculate the input to the variable gain means from the input value and the coupling capacitor charge and calculate a new charge. The two diodes in the input circuit divide the behavior into three areas, when diode 42 conducts, when diode 43 conducts, when neither conduct. Since the diodes conduct beyond the clipping or limiting level of transconductance amplifier 45, the simple approach to simulating these devices is to assume that they do not exist when not conducting and appear as a resistor in series with the conduction voltage when they do conduct. Once the input values are computed, then the change in charge on the coupling capacitors can be computed so that the new bias may be calculated. Note that this must also account for the output impedance of the simulated preceding stage.

b. Calculate the output of the variable gain means from its input and the gain control signal. The differential input value is used to calculate the transfer character of the differential input stage of a transconductance amplifier such as the CA.3080. This characteristic is a odd polynomial function similar to arctangent. The actual output is then the product of the transfer character and the gain control signal.

c. Compute the harmonic distortion using the actual output as the input to a polynomial function describing the non-clipped distortion.

d. Compute the output stage by noting that the speaker emulation, components 77 through 79, has a long time constant and for the small time step is a current source. Then the non-linear behavior can be easily solved or approximated. Once it is solved, then a new current value for inductor 79 and a new voltage value for capacitor 77 can be determined for the next calculation. The solution of the output stage is output.

e. Compute the gain control by performing the absolute value and filtering operations and using this data in the next series of calculations.

f. The inclusion of feedback will require multiple calculations and estimating procedures similar to the Newton-Raphson techniques. While this technique is functionally like the device being simulated, feedforward techniques requiring a single iteration are much faster than feedback techniques requiring many iterations. To that end, the amount of feedback is used to alter the character of the open loop transfer functions to being wider bandwidth, more constant gain, and less non-linear and thereby making them approximately equivalent.

g. Optionally compute the speaker simulation. This is needed for direct recording or sound reinforcement systems; but is not needed for driving instrument speakers. The details of such emulation are found in my U.S. Pat. No. 4,995,084 and are included herewith by reference.

ANOTHER EMBODIMENT

Figure 12:
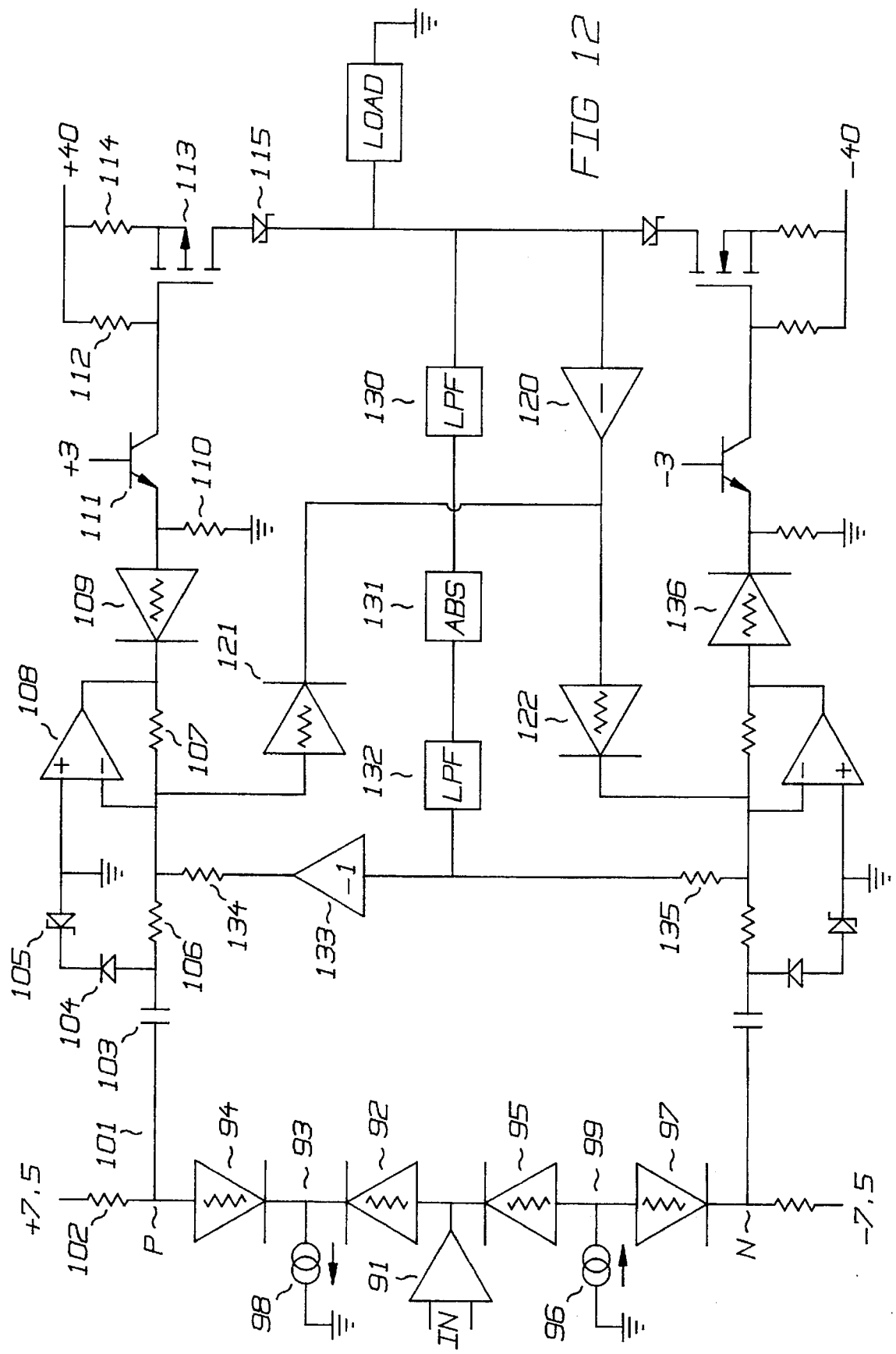
FIG. 12 is a high power embodiment based upon non-linear amplifiers and non-linear feedback.

FIG. 12 shows a complementary phase splitter and bipolar push-pull output which emulates push-pull pentodes with a poorly regulated power supply. FIG. 12 is a combination of FIGS. 10 and 11 of the preceding application Ser. No. 07/914596.

The components 91 through 99 are an approximation to the phase splitter for a bipolar amplifier which requires both inputs in-phase. Since the two triodes in a differential amplifier phase splitter compensate each other, the stage produces very little distortion until clipping. The output resistance of the phase splitter is about twice the triode plate resistance normally, but becomes nearly infinite when clipping.

When the output of amplifier 91 goes high, network 92 pulls up voltage at 93. When the voltage at 93 approaches the plate voltage P, network 94 becomes more resistive and disconnects when the voltage at 93 is greater than the voltage at P. At the same time, network 95 disconnects and the current from source 96 flows through network 97 to plate N. Symmetric behavior occurs when the amplifier 91 output goes negative: network 92 disconnects, P has current from current source 98, network 95 pulls down voltage at 99, and network 97 disconnects from plate N. The networks 94, 95, and 97 use an extra diode in series with the input to keep reverse currents from flowing.

The circuit of FIG. 12 provides the soft cutoff for the grid circuit of the output stage. Since the negative half of the output stage operates symmetrically to the positive half, only the positive half will be detailed. The input circuit drives inputs P and N of FIG. 12. Resistor 102 is the plate resistor for the input circuit. Capacitor 103 is the coupling capacitor. Diodes 104 and 105 emulate positive grid conduction. Zener diode 105 adjusts for the nominal zero bias of this stage. Resistor 106 is the grid resistor which drives amplifier 108 with feedback resistor 107. Network 109 is nominally a squaring, second order emulation of the pentode transfer characteristic. This gain varying characteristic provides smooth crossover and the variable gain for emulating tube compression. Amplifier 111, shown as a transistor, shifts the level of the signal to the output supply voltage +40 with the help of resistor 112. MOSFET 113 with source resistor transfers the voltage on resistor 112 to a current through resistor 114. Bias resistor 110 is adjusted to overcome the threshold voltage of MOSFET 113. The remaining bias is established by the voltage on the base of transistor 111. Zener diode allows the load to fly back some before it is clamped.

The components 103–106 form a bias shifter as do their corresponding components of FIG. 1. The diodes correspond to the grid conduction of tubes 8 or 9. The capacitor 103 corresponds to their coupling capacitors. And resistor 106 corresponds to their grid resistors.

Inverting amplifier 120 and non-linear networks 121 and 122 feedback the output to emulate the plate resistance of a pentode. Notice that the feedback loop goes through both non-linear networks. Consequently, the plate resistance and the transfer characteristics are functions of both the output and the input. This is seen in the different slopes of pentode plate curves.

The saturation region is emulated by resistor 114. Again, the entire characteristic is not perfect, but around the load line it is a good approximation.

The poor regulation of the power supply coupled with screen grid operation creates the compression found in tube amplifiers. When the power supply sages under the load of large signals, the screen voltage goes down in a manner dictated by the power supply filter. The drop in screen voltage lowers the output current and lowers the gain of the tube.

The screen grid voltage shift can be lumped into a control grid shift according to Thomas Martin in his book *Electronic Circuits,* Prentice-Hall, pages 84–87 providing the signal is scaled appropriately.

Although the power supply could drive this circuit, it is simpler to estimate the power current with filter 130. The resulting signal is rectified by 131 and then filtered by 132 which has the same time constants and overshoot as the emulated power supply. The output of 132 is fed to the negative half by resistor 135 while being inverted by 133 and fed to the positive half by resistor 134. An increasing output then reduces the bias on networks 109 and 136, reduces the output currents, increases the resistance of these networks and lowers the gain. The compression control signal from the output of filter 132 is canceled in the output.

This is similar to the behavior of tube compressor/ expanders such as the expander, FIG. 16.10, *Radiotron Designers Handbook,* RCA Corporation, 1954. The difference lies in the characteristics of the filter 132. Compressors react quickly to rising signals and slower to falling signals. But the power supply reacts similarly in both directions at a medium rate. The filters of compressors are non-linear single pole while the power supply is multipole and may have overshoot.

The input to filter 130 may be taken from the output in a feedback fashion or may be taken from an input for a feed forward operation.

Notice that with the appropriate choices of component values, the circuit of FIG. 12 exhibits the four desired regions of operation. When the input signal is so large that it cause the grid conduction emulation diode 104 to conduct, then the MOSFET 113 can source a limited current. If the load is a low impedance, then MOSFET 113 does not saturate and it exhibits a high impedance as determined by the loop of 120, 121, and 107 through 115. If the load is a high impedance, then MOSFET 113 does saturate and exhibits a low impedance as determined by its bulk resistance and resistor 114. When the grid conduction diodes are not being clipped, then the non-linear elements 109, 136, 121, and 122 introduce harmonics at high levels but leave the amplifier essentially without distortion at low levels.

Notice further that the non-linear elements 109 and 136 produce the crossover between two sides of the push-pull output stage. With a squaring non-linear characteristic, the crossover region has little if any distortion. Beyond the crossover region, for example, when the level shifting transistor 111 does not conduct, non-linear elements 109 and 136 produce harmonic distortion which rises with the signal level. This rising distortion character traverses the one percent level and rises to blend in with the clipped distortion.

Although the present invention has been described and illustrated in detail, it is to be clearly understood that the same is by way of illustration and example only, and is not to be taken by way of limitation. The spirit and scope of the present invention are to be limited only by terms of the appended claims.

What is claimed:

1. A solid state amplifier for the emulation of vacuum tube audio power amplifiers having a power supply which has a response to said vacuum tube amplifier and having an input and an output and including:

input means for receiving an input signal from said input;
a controlled amplifier means responsive to said input means and a gain control signal for producing a controlled output signal wherein the maximum level of said controlled output signal is responsive to said gain control signal;
an output means responsive to said controlled output signal for producing an output signal at said output and for producing a load signal indicative of an output of said vacuum tube amplifier under load of a speaker; and
gain control means responsive to said load signal for producing said gain control signal for increasing the gain of said controlled amplifier for increasing load signal and for emulating said response of said power supply to said vacuum tube power amplifier.

2. The solid state amplifier means of claim 1 wherein said input means includes feedback means connected to said output.

3. The solid state amplifier means of claim 1 wherein said input means includes a first capacitor coupling means and diode means for changing the bias on said capacitor coupling means as a function of said input signal.

4. The solid state amplifier means of claim 3 wherein said input means includes a second capacitor means.

5. The solid state amplifier means of claim 1 wherein said output means includes a power amplifier for driving a speaker.

6. The solid state amplifier means of claim 1 wherein said output means includes an operational amplifier and a filter wherein said filter creates the load response of a speaker in the output of said operational amplifier.

7. The solid state amplifier means of claim 1 wherein said gain control means includes means for emulating the character of self biased tube amplifiers.

8. The solid state amplifier means of claim 1 wherein said gain control means includes means for creating even harmonics.

9. The solid state amplifier means of claim 1 wherein said output means includes non-linear means for emulating the plate resistance characteristic of the output tubes of said vacuum tube amplifier.

10. The solid state amplifier means of claim 9 wherein said non-linear means has two terminals and includes a ladder of series connected diodes connected with a network of resistors for progressively adding resistors as a function of the voltage across said terminals.

11. The solid state amplifier means of claim 9 wherein said non-linear means produces its non-linearity with the logarithmic and exponential characteristics of semiconductor junctions.

12. The solid state amplifier means of claim 1 wherein said input, controlled output, output, and gain control signals are represented by digital values and said input means, said controlled amplifier means, said output means and said gain control means are programs in a digital computer.

13. The solid state amplifier means of claim 12 wherein said digital programs simulate feedback by altering non-linear characteristics and filter characteristics.

14. The solid state amplifier means of claim 1 wherein said output means is a switching current amplifier and said load signal is a current feedback signal.

15. A solid state amplifier for emulating the character of a vacuum tube amplifier having a power supply, said power supply having a response to said vacuum tube amplifier, said solid state amplifier comprising:

an input and an output;
means for operating in three regions; a) an unclipped region; b) a first clipped region at a first level; and c) a second clipped region at a second level greater than said first level; and wherein said first clipped region and first level vary in response to the emulation of said power supply response to said vacuum tube amplifier.

16. The solid state amplifier of claim 15 wherein said first level occurs for low impedance loads and said second level occurs for high impedance loads.

17. The solid state amplifier of claim 15 which includes means for emulating a speaker load and wherein said first level occurs for middle frequencies and said second level occurs for the low frequencies of the bass resonance of said speaker.

18. The solid state amplifier of claim 15 wherein said unclipped region is further divided into an essentially linear region of less than one percent distortion and a non-linear region of greater than one percent distortion.

19. The solid state amplifier of claim 18 wherein said amplifier emulation includes a transconductance amplifier whose gain is a function of a signal in said amplifier.

20. The solid state amplifier of claim 18 wherein said amplifier emulation includes non-linear means for creating said unclipped region.

21. The solid state amplifier of claim 20 wherein said non-linear means includes series diodes and parallel resistors connected in a ladder.

22. The solid state amplifier of claim 20 wherein said non-linear means includes series connected pairs of a parallel resistor and diode.

23. The solid state amplifier of claim 20 wherein said non-linear means uses the logarithmic and exponential characteristics of semiconductor junctions to produce a non-linear relationship between the voltage across said non-linear means to the current flowing through said non-linear means.

24. The solid state amplifier of claim 15 wherein said first clipped region and first level are created by a controlled gain amplifier being gain controlled in response to a gain controller.

25. The solid state amplifier of claim 24 wherein said first clipped region and first level vary also in response with means for emulating a power tube self-bias means of said vacuum tube amplifier.

26. The solid state amplifier of claim 15 which include input means for capacitively coupling said input and for bias shifting said input.

27. The solid state amplifier of claim 15 wherein said amplifier emulation is performed by a digital computer with programs acting on digital values instead of analog circuits acting upon analog values.

28. The solid state amplifier of claim 15 wherein said output means includes direct equalization means for emulating the output of a microphone placed near a speaker driven by said vacuum tube amplifier.

29. A low power solid state amplifier for the vacuum tube audio power amplifiers driving a speaker load and having a power supply which has a response to said vacuum tube amplifier, said solid state amplifier having an input and an output and comprising:

input means for receiving an input signal;

a controlled amplifier means responsive to said input means and a gain control signal for producing a controlled output signal;

an output means responsive to said controlled output signal for producing an output signal at said output, for emulating said speaker load, and for producing a load signal indicative of said response of said power supply of said vacuum tube amplifier under load of said speaker; and gain control means responsive to said load signal for producing said gain control signal.

30. The low power amplifier of claim 29 wherein said input means includes a first capacitor coupling means and diode means for changing the bias on said capacitor coupling means as a function of the input signal.

31. The low power amplifier of claim 30 wherein said input means includes a second capacitor coupling means.

32. The solid state amplifier of claim 29 wherein said input means includes feedback means connected to said output.

33. The low power amplifier of claim 29 wherein said controlled amplifier means is a transconductance amplifier.

34. The low power amplifier of claim 29 wherein said output means includes an operational amplifier and a filter wherein said filter creates a response in said operational amplifier that emulates the response of said vacuum tube amplifier with said speaker load.

35. The low power amplifier of claim 29 wherein said gain control means includes means for producing odd harmonics in said output.

36. The low power amplifier of claim 29 wherein said gain control means includes means and for emulating the response of said power supply for said vacuum tube power amplifier.

37. The low power amplifier of claim 29 wherein said gain control means includes means for emulating the character of self biased tube amplifiers.

38. The low power amplifier of claim 29 wherein said gain control means includes means for creating even harmonics.

39. The low power amplifier of claim 29 wherein said output means includes plate resistance emulating means for emulating the plate characteristic of vacuum tubes.

40. The low power amplifier of claim 39 wherein said plate resistance emulating means is a non-linear means.

41. The low power amplifier of claim 40 wherein said non-linear means has two terminals and includes a ladder of series connected diodes connected with a network of resistors for progressively adding resistors as a function of the voltage across said terminals.

42. The low power amplifier of claim 40 wherein said non-linear means produces its non-linearity with the logarithmic and exponential characteristics of semiconductor junctions.

43. The low power amplifier of claim 29 wherein said input, controlled output, output, and gain control signal are represented by digital values and said input, said controlled amplifier means, said output means and said gain control means are programs in a digital computer.

44. The solid state amplifier means of claim 43 wherein said digital programs simulate feedback by altering non-linear characteristics and filter characteristics.

45. The low power amplifier of claim 43 wherein digital computer means also includes a direct equalization program for emulating the output of said speaker.

46. The low power amplifier of claim 29 which includes direct equalization program emulating the output of a microphone placed near said emulated speaker.

47. A semiconductor output amplifier having an input, and output, and a power supply for emulating a push-pull pentode vacuum tube amplifier comprising:

a phase splitter for receiving said input and producing first and second grid signals;

a first non-linear amplifier including grid conduction emulation means for receiving said first grid signal for producing a first drive signal;

a second non-linear amplifier including grid conduction emulation means for receiving said second grid signal for producing a second drive signal;

means for operating in three regions; a) an unclipped region; b) a first clipped region at a first level; and c) a second clipped region at a second level greater than said first level; and wherein said first clipped region and first level vary in response to the emulation of the response of said power supply of said vacuum tube amplifier to said vacuum tube amplifier; and an output amplifier means for receiving said first and second drive signals and producing said output signals.

48. The amplifier means of claim 47 including feedback means responsive to said output and wherein said first and second non-linear amplifier means are also responsive to feedback signals from said feedback means.

49. The amplifier means of claim 48 wherein said feedback means is nonlinear.

50. The amplifier means of claim 47 wherein said first or second non-linear amplifier means includes a plurality of series diodes.

51. The amplifier means of claim 50 wherein said first or second non-linear amplifier means includes resistors connected to said diodes in a ladder.

52. The amplifier means of claim 50 wherein said first or second non-linear amplifier means includes resistors in parallel with said diodes.

53. The amplifier means of claim 50 wherein said first or second non-linear amplifier means include transistor means connected to said diode means.

54. The amplifier means of claim 47 wherein said output amplifier means includes gain control means for producing a gain control signal and wherein the gain of said first or second non-linear amplifier changes in response to said gain control signal.

* * * * *